(12) United States Patent
Imai

(10) Patent No.: US 12,355,405 B2
(45) Date of Patent: Jul. 8, 2025

(54) POWER AMPLIFIER CIRCUIT AND DIFFERENTIAL POWER AMPLIFIER CIRCUIT

(71) Applicant: Murata Manufacturing Co., Ltd., Kyoto (JP)

(72) Inventor: Shohei Imai, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 333 days.

(21) Appl. No.: 18/048,065

(22) Filed: Oct. 20, 2022

(65) Prior Publication Data

US 2023/0128900 A1   Apr. 27, 2023

(30) Foreign Application Priority Data

Oct. 22, 2021  (JP) .................. 2021-173286

(51) Int. Cl.
  H04B 1/04  (2006.01)
  H03F 1/56  (2006.01)
  H03F 3/20  (2006.01)
  H03F 3/21  (2006.01)

(52) U.S. Cl.
  CPC ............... *H03F 3/211* (2013.01); *H03F 1/56* (2013.01)

(58) Field of Classification Search
  CPC .......... H03F 3/211; H03F 1/56; H03F 3/3432; H03F 1/302; H04B 2011/0408; H04B 1/04
  See application file for complete search history.

(56) References Cited

U.S. PATENT DOCUMENTS

| | | | |
|---|---|---|---|
| 2001/0052820 A1 | 12/2001 | Morizuka | |
| 2005/0168287 A1* | 8/2005 | Enomoto | H03F 1/30 330/290 |
| 2009/0251220 A1* | 10/2009 | Matsuda | H03F 1/0261 330/296 |
| 2009/0295480 A1* | 12/2009 | Ikeda | H03F 3/45183 330/253 |
| 2010/0109781 A1* | 5/2010 | Deguchi | H03F 1/30 330/296 |
| 2016/0322944 A1* | 11/2016 | Hase | H03F 3/245 |
| 2020/0127622 A1* | 4/2020 | Matsumoto | H03F 1/22 |
| 2020/0252029 A1* | 8/2020 | Fukasawa | H03F 1/0261 |

FOREIGN PATENT DOCUMENTS

| | | |
|---|---|---|
| CN | 104113291 A | 10/2014 |
| JP | 2001-274636 A | 10/2001 |

* cited by examiner

*Primary Examiner* — Andrew Wendell
(74) *Attorney, Agent, or Firm* — McDonald Hopkins LLC

(57) ABSTRACT

A first transistor having a base or a gate supplied with a high-frequency signal through a capacitor, and supplied with a bias current through a resistive element, a second transistor having a base or a gate connected to an emitter or a source of the first transistor, and a collector or a drain connected to an output terminal, and a third transistor having a collector or a drain connected to the base or the gate of the first transistor, and an emitter or a source connected to reference potential are provided, and the third transistor is provided such that a current flowing through the collector or the drain of the third transistor increases when a current flowing through the collector or the drain of the second transistor increases.

20 Claims, 17 Drawing Sheets

POWER AMPLIFIER CIRCUIT AND DIFFERENTIAL POWER AMPLIFIER CIRCUIT

CROSS REFERENCE TO RELATED APPLICATION

This application claims priority from Japanese Patent Application No. 2021-173286 filed on Oct. 22, 2021. The content of this application is incorporated herein by reference in its entirety.

BACKGROUND ART

The present disclosure relates to a power amplifier circuit and a differential power amplifier circuit.

There has been known a power amplifier circuit that includes a plurality of common-emitter transistors at a final stage, and a bias circuit that supplies a base bias to each of the transistors at the final stage, and in which a high-frequency signal is input to a base of the transistor at the final stage through a capacitor (see, for example, Japanese Unexamined Patent Application Publication No. 2001-274636).

In the disclosure disclosed in Japanese Unexamined Patent Application Publication No. 2001-274636, it is necessary to provide an emitter having a large area in order for the transistor at the final stage to obtain a large output current. Thus, in the disclosure described in Japanese Unexamined Patent Application Publication No. 2001-274636, since parasitic capacitance between the base and the emitter in the transistor at the final stage becomes large, impedance becomes small for a signal in a high frequency band. Accordingly, in the disclosure described in Japanese Unexamined Patent Application Publication No. 2001-274636, the impedance of the transistor at the final stage has frequency characteristics, and there arises a problem in that realization of broadband characteristics is inhibited.

Further, in the disclosure described in Japanese Unexamined Patent Application Publication No. 2001-274636, since the impedance becomes small for a signal in a high frequency band, capacitance of a bias cut capacitor connected in series with the transistor at the final stage is to be made small. That is, in the disclosure described in Japanese Unexamined Patent Application Publication No. 2001-274636, it is necessary to increase a size of the bias cut capacitor, which causes a problem in that a circuit scale is increased.

BRIEF SUMMARY

The present disclosure provides a power amplifier circuit for increasing input impedance for a high-frequency signal.

A power amplifier circuit according to an aspect of the present disclosure includes a first transistor having a base or a gate supplied with a high-frequency signal through a capacitor, and supplied with a bias current through a resistive element, a second transistor having a base or a gate connected to an emitter or a source of the first transistor, and a collector or a drain connected to an output terminal, and a third transistor having a collector or a drain connected to the base or the gate of the first transistor, and an emitter or a source connected to reference potential, wherein the third transistor is provided such that a current flowing through the collector or the drain of the third transistor increases when a current flowing through the collector or the drain of the second transistor increases.

According to the present disclosure, it is possible to provide a power amplifier circuit for increasing input impedance for a high-frequency signal.

DETAILED DESCRIPTION

Power Amplifier Circuit 100
Configuration

A power amplifier circuit 100 is mounted in a mobile phone, for example, and is used to amplify power of a signal to be transmitted to a base station. The power amplifier circuit 100 can amplify power of a signal conforming to communication standards, such as second generation mobile communication system (2G), third generation mobile communication system (3G), fourth generation mobile communication system (4G), fifth generation mobile communication system (5G), long term evolution (LTE)—frequency division duplex (FDD), LTE—time division duplex (TDD), LTE-Advanced, LTE-Advanced Pro, sixth generation mobile communication system (6G), or the like. Note that, the communication standards for a signal amplified by the power amplifier circuit 100 are not limited thereto. The power amplifier circuit 100 amplifies an input signal RFin, and outputs an output signal RFout. The input signal is a radio-frequency (RF) signal, and a frequency of the input signal is, for example, from about several GHz to several tens of GHz.

Figure 1:
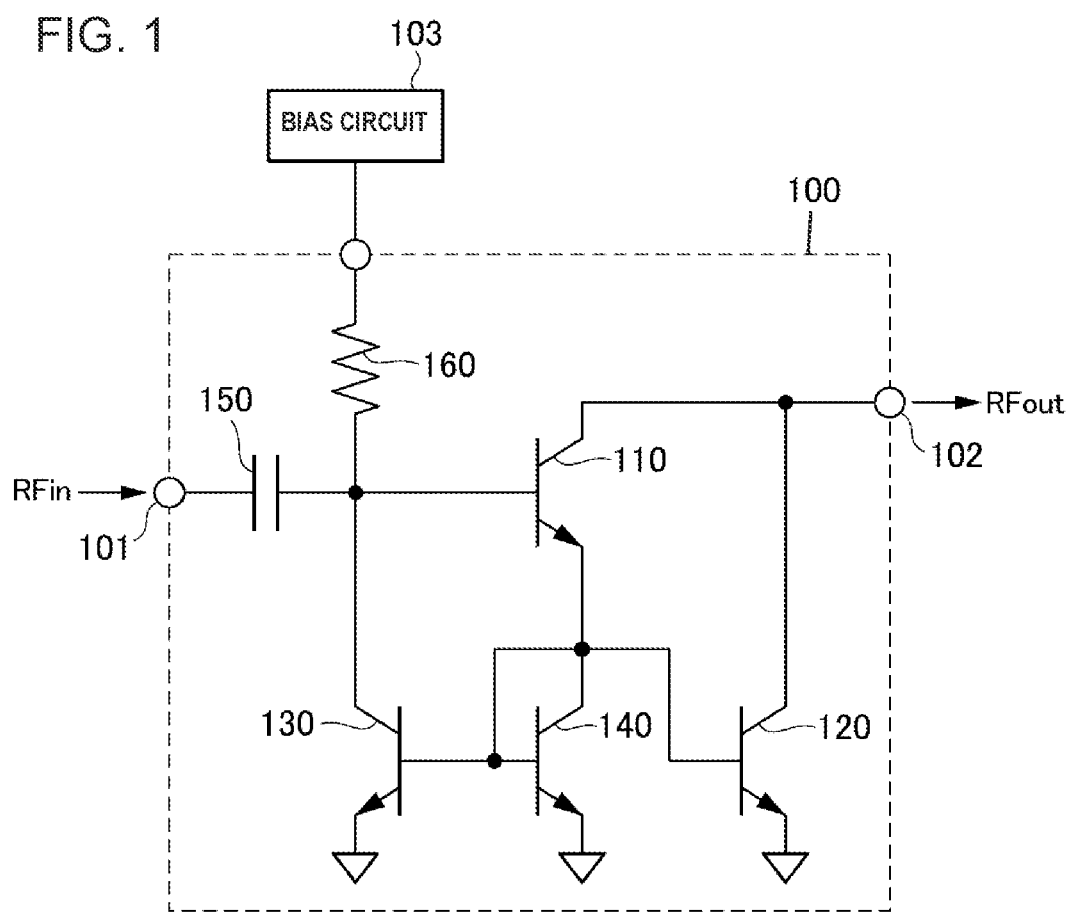
FIG. 1 is a configuration diagram illustrating an example of a configuration of a power amplifier circuit according to the present embodiment.

The power amplifier circuit 100 according to the present embodiment is an amplifier circuit having high input impedance. A configuration of the power amplifier circuit 100 will be described with reference to FIG. 1. FIG. 1 is a configuration diagram illustrating an example of a configuration of the power amplifier circuit 100 according to the present embodiment. As illustrated in FIG. 1, the power amplifier circuit 100 includes, for example, a transistor 110, a transistor 120, a transistor 130, a transistor 140, a capacitor 150, and a resistor 160. Note that, although not particularly mentioned below, it is assumed that a collector of the transistor 110 and a collector of the transistor 120 in the power amplifier circuit 100 according to the present embodiment are connected to a terminal (not illustrated) of an external power supply through an output terminal 102.

The transistors 110 to 140 are, for example, transistors that realize high input impedance by being connected to each other. Hereinafter, as an example, description will be given assuming that the transistors 110 to 140 are bipolar transistors. Note that, the transistors 110 to 140 may be field-effect transistors. In this case, in each of the transistors 110 to 140, a base is replaced with a gate, a collector is replaced with a drain, and an emitter is replaced with a source.

The transistor 110 is a transistor that amplifies the input signal RFin. A base of the transistor 110 is connected to an input terminal 101 through the capacitor 150. Additionally, the base is supplied with a bias current from a bias circuit 103 through the resistor 160. An emitter of the transistor 110 is connected to a base of the transistor 120. Further, the emitter, for example, may be connected to a collector of the transistor 140. The collector of transistor 110 is connected to the collector of the transistor 120. Further, the collector of the transistor 110 may be connected to, for example, the output terminal 102. In this manner, the transistor 110 can increase input impedance by amplifying the input signal RFin by using an emitter-follower circuit. Further, since the transistor 110 is the emitter-follower circuit, and can decrease output impedance, a voltage drop of a base current of the transistor 120 can be reduced.

The transistor 120 is a transistor that amplifies the input signal RFin amplified by the transistor 110 and outputs the output signal RFout. The transistor 120 is a transistor Darlington-connected to the transistor 110. Specifically, the base of the transistor 120 is connected to the emitter of the transistor 110. In addition, the base, for example, may be connected to a base of the transistor 130. Further, the base, for example, may be connected to the collector of the transistor 140. The collector of the transistor 120 is connected to the output terminal 102. The emitter of the transistor 120 may be connected to reference potential. The reference potential is, for example, a ground.

The transistor 130 is a transistor for increasing the input impedance of the transistor 110, and suppressing thermal runaway of the transistor 120. An emitter of the transistor 130 is connected to the reference potential. The base of the transistor 130 is connected to the base of the transistor 120. Further, the base is connected to the emitter of the transistor 110. A collector of the transistor 130 is connected to the base of the transistor 110. In the present embodiment, the transistor 130 and the transistor 120 form a mirror circuit. That is, the transistor 130 acts as a constant current source in the power amplifier circuit 100. Thus, a base current of the transistor 110 can be pulled in, so that the input impedance of the transistor 110 can be increased. Thus, since an emitter current of the transistor 110 can be reduced, the base current of the transistor 120 can be reduced to suppress thermal runaway. Here, in order to be thermally coupled to the transistor 110 and have a temperature similar to that of the transistor 110, the transistor 130 is desirably arranged on the semiconductor substrate same as the transistor 110. Accordingly, since a collector current of the transistor 130 can be increased in accordance with an increase in a current of the transistor 120, the base current of the transistor 110 is decreased, and thermal runaway can be suppressed. Note that, operation of suppressing thermal runaway will be described later.

The transistor 140 is a transistor for operating the transistor 110 as the emitter-follower. In other words, the transistor 140 is a transistor for increasing the current of the emitter of the transistor 110. A base of the transistor 140 is connected to the base of the transistor 130. The collector of the transistor 140 is connected to the emitter of the transistor 110. The base and the collector of the transistor 140 are connected to each other. An emitter of the transistor 140 is connected to the reference potential. Thus, the transistor 140 can increase the emitter current of the transistor 110, and thus can operate the transistor 110 as the emitter-follower to increase the input impedance. Note that, the transistor 140 may be omitted.

The capacitor 150 is a coupling capacitor connected between the input terminal 101 and the base of the transistor 110. Note that, the capacitor 150 is provided inside the power amplifier circuit 100 in FIG. 1, but may be provided outside the power amplifier circuit 100.

The resistor 160 is a resistive element connected between the bias circuit 103 and the base of the transistor 110. Note that, the resistor 160 is provided inside the power amplifier circuit 100 in FIG. 1, but may be provided outside the power amplifier circuit 100.

Comparative Examples

Figure 14:
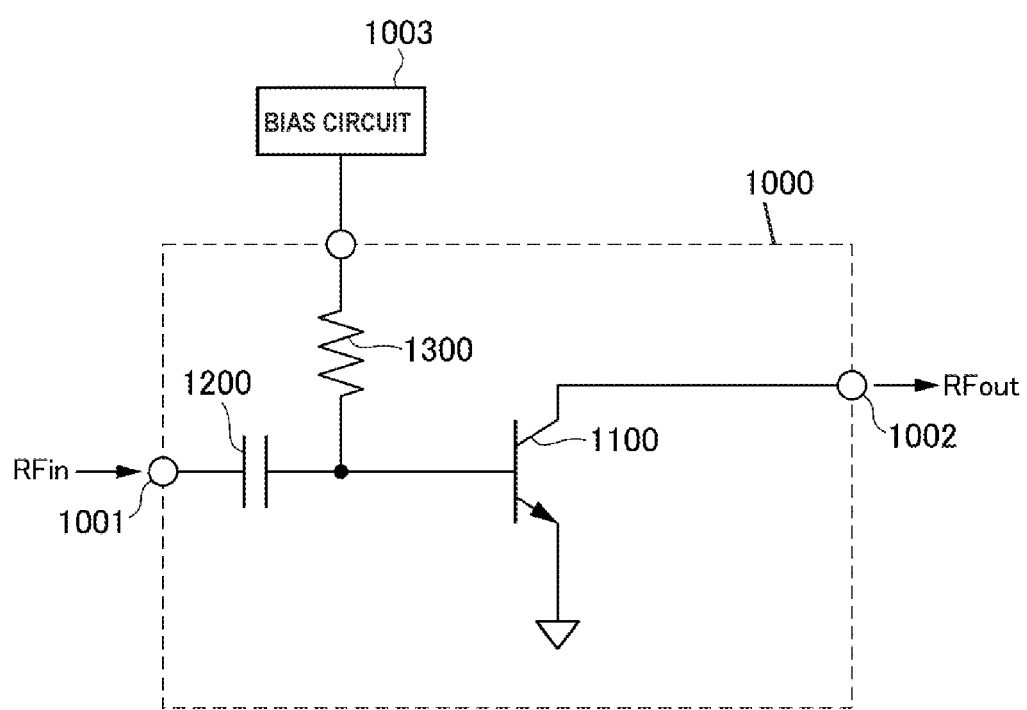
FIG. 14 is a diagram illustrating an example of a configuration of the power amplifier circuit according to the first comparative example.

A power amplifier circuit 1000 according to a first comparative example will be described with reference to FIG. 14. FIG. 14 is a diagram illustrating an example of a configuration of the power amplifier circuit 1000 according to the first comparative example. As illustrated in FIG. 14, the power amplifier circuit 1000 includes, for example, a transistor 1100, a capacitor 1200, and a resistor 1300. The transistor 1100, the capacitor 1200, and the resistor 1300 are similar to the transistor 120, the capacitor 150, and the resistor 160 illustrated in FIG. 1. Unlike the transistor 120, a base of the transistor 1100 that is a transistor at a final stage is connected to an input terminal 1001 through the capacitor 1200.

The power amplifier circuit 1000 illustrated in FIG. 14 has a problem in that a size of the circuit is large. Specifically, in the power amplifier circuit 1000, unlike the power amplifier circuit 100, the transistor 1100 is not Darlington-connected. Thus, in the power amplifier circuit 1000, a base current of the transistor 1100 is significantly reduced, as compared to the power amplifier circuit 100. Accordingly, input impedance of the transistor 1100 is significantly reduced. In the power amplifier circuit 1000, capacitance of the capacitor 1200 is determined so that impedance of the capacitor 1200 for a high-frequency signal does not become larger with respect to input impedance of the transistor 1100. That is, when the input impedance of the transistor 1100 is small, it is necessary to increase the capacitance, and thus it is necessary to increase a size of the capacitor 1200. Thus, in the power amplifier circuit 1000, the size of the circuit is large.

Figure 15:
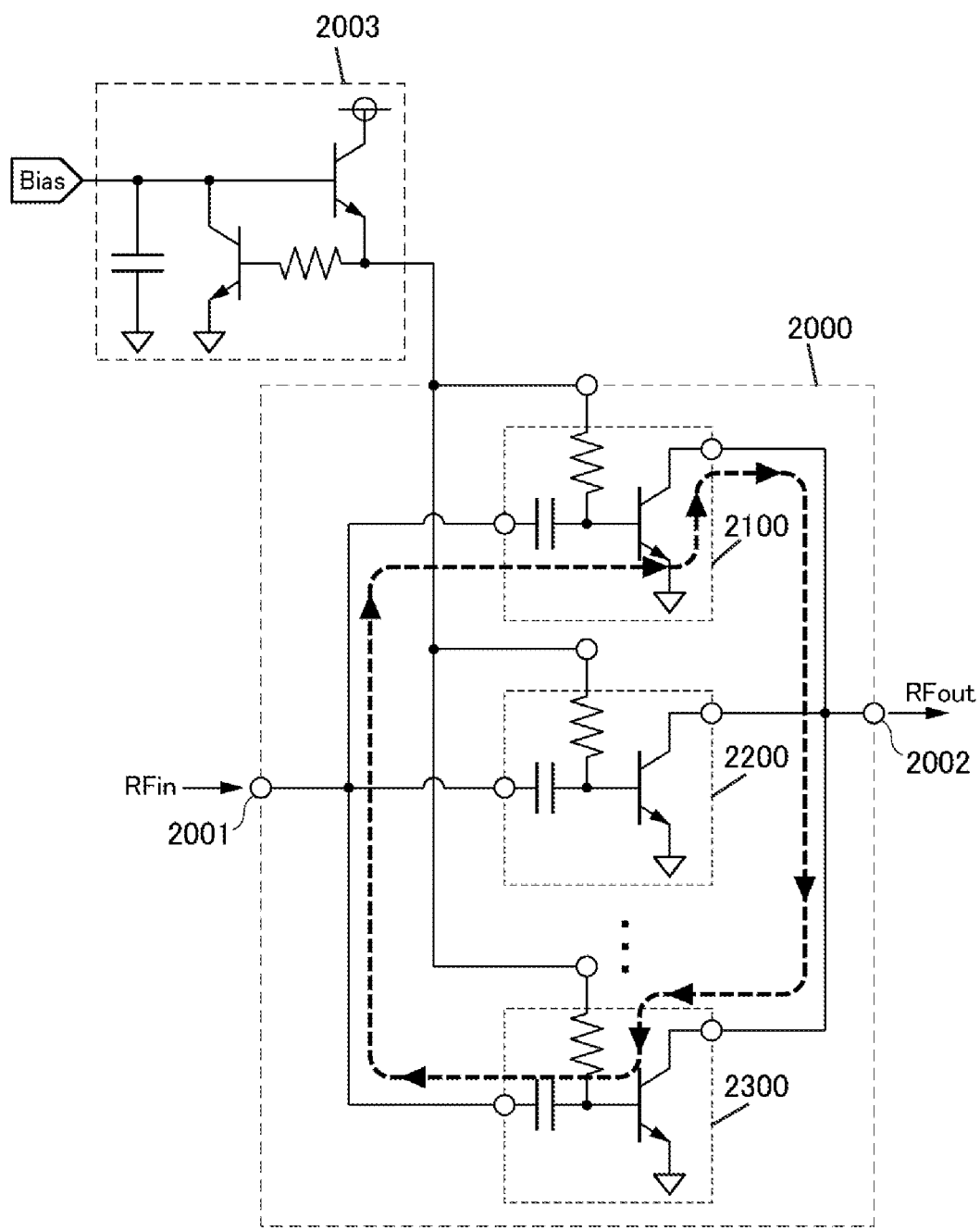
FIG. 15 is a diagram illustrating an example of a configuration of a power amplifier circuit according to a second comparative example.

Next, a power amplifier circuit 2000 according to a second comparative example will be described with reference to FIG. 15. FIG. 15 is a diagram illustrating an example of a configuration of the power amplifier circuit 2000 according to the second comparative example. As illustrated in FIG. 15, the power amplifier circuit 2000 is obtained by, for example, combining power amplifier circuits 2100 to 2300 according to the first comparative example on the same semiconductor substrate.

In the power amplifier circuit 2000, there is a possibility that the plurality of amplifier circuits 2100 to 2300 oscillates. Specifically, in the power amplifier circuit 2000, for example, when a harmonic current amplified by the amplifier circuit 2100 flows back to a collector of each of the amplifier circuits 2100 and 2200, the current is supplied again to a base of the amplifier circuit 2100. At this time, when a high-frequency current supplied to the base of the amplifier circuit 2100, and the current supplied again to the base of the amplifier circuit 2100 have a difference of one wavelength, the power amplifier circuit 2000 oscillates.

Figure 16:
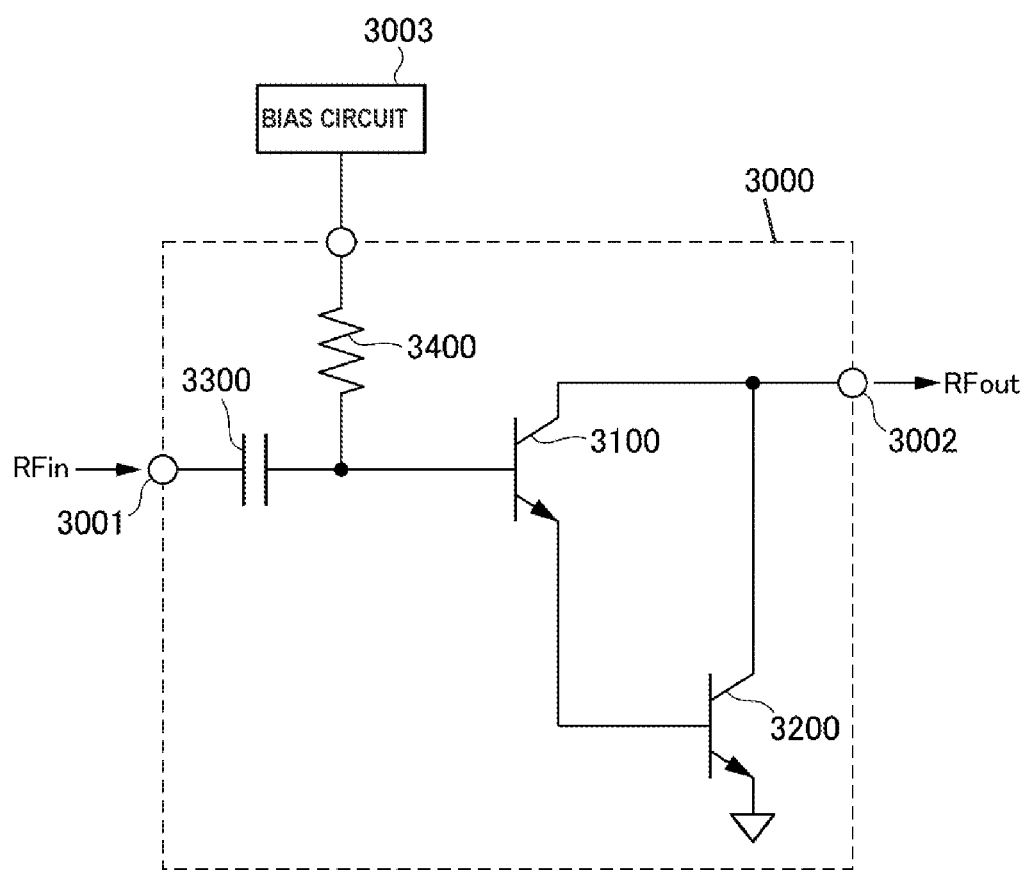
FIG. 16 is a diagram illustrating an example of a configuration of a power amplifier circuit according to a third comparative example.

Next, a power amplifier circuit 3000 according to a third comparative example will be described with reference to FIG. 16. FIG. 16 is a diagram illustrating an example of a configuration of the power amplifier circuit 3000 according to the third comparative example. As illustrated in FIG. 16, the power amplifier circuit 3000 is an amplifier circuit configured with Darlington-connected transistors. The power amplifier circuit 3000 includes a transistor 3100, a transistor 3200, a capacitor 3300, and a resistor 3400. Since a connection relationship among the transistor 3100, the transistor 3200, the capacitor 3300, and the resistor 3400 is the same as the connection relationship among the transistor 110, the transistor 120, the capacitor 150, and the resistor 160, the description thereof will be omitted.

The power amplifier circuit 3000 has a problem in that thermal runaway occurs. Specifically, when power consumption of the transistor 3200 increases, since the temperature rises, a rising voltage decreases. Then, when a constant bias voltage is applied to a base of the transistor 3100, emitter potential of the transistor 3100 decreases, so that a voltage between the base and the emitter of the transistor 3100 increases. Thus, a base current of the transistor 3100 increases. Then, since the base current of the transistor 3100 is multiplied by Hfe (transistor amplification factor), a base current of the transistor 3200 increases. Thus, a collector current of the transistor 3200 increases. Accordingly, the power consumption of the transistor 3200 further increases, and the above-described process is repeated to cause thermal runaway.

Operation

Returning to FIG. 1, the operation of the power amplifier circuit 100 will be described in comparison with the power amplifier circuits 1000, 2000, and 3000 according to the comparative examples.

As illustrated in FIG. 1, the input signal RFin is supplied to the base of the transistor 110 through the capacitor 150. The transistor 110 amplifies the input signal RFin and supplies the input signal RFin to the transistor 120 by using the emitter-follower. Further, the emitter current of the transistor 110 is supplied as a collector current of the transistor 140 that is diode-connected. Accordingly, the input impedance of the transistor 110 as the emitter-follower can be increased. Then, the emitter current of the transistor 110 is supplied to the base of the transistor 130. The transistor 130 forms a mirror circuit together with the transistor 140, and thus operates as a constant current source. Since the collector current flowing through the transistor 130 is made constant, noise resistance of the power amplifier circuit 100 is improved by suppressing a current supplied from the bias circuit 103 from becoming excessively small. As a result, in this manner, since the input impedance of the power amplifier circuit 100 can be increased, and the capacitor 150 can be made small, the circuit can be made small.

Figure 2:
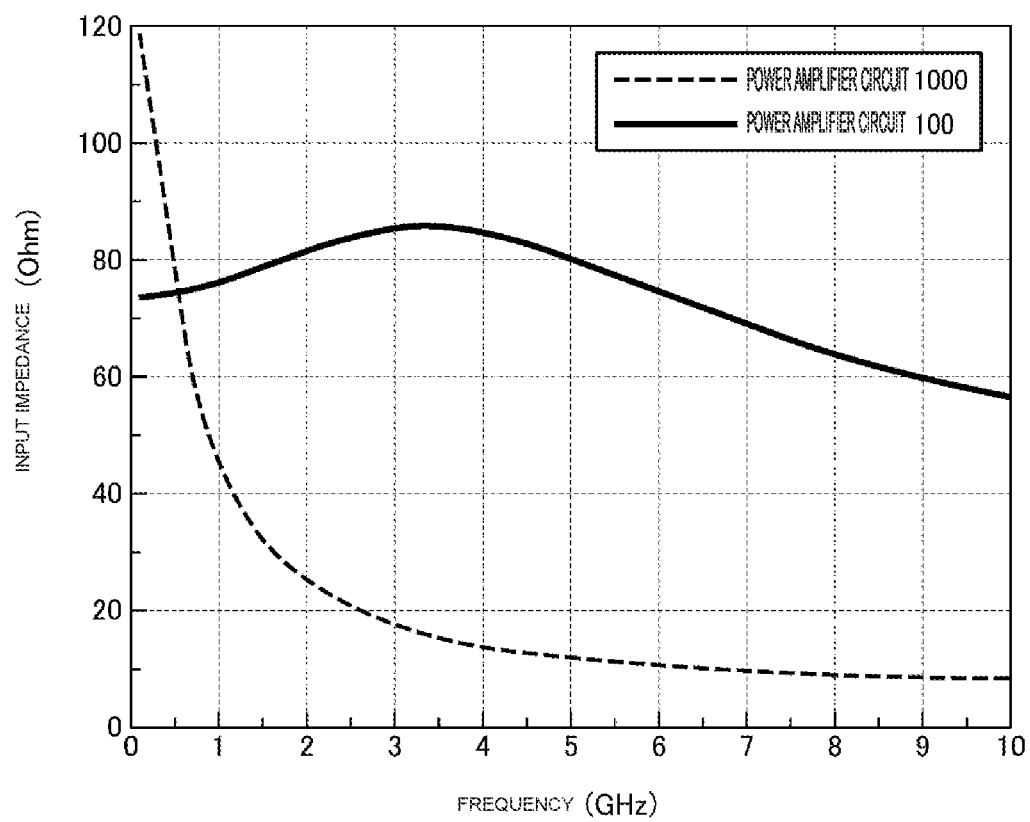
FIG. 2 is a graph showing an example of a relationship between frequency and input impedance of each of a power amplifier circuit according to a first comparative example and the power amplifier circuit according to the present embodiment.

Here, with reference to FIG. 2, a fact will be described that the input impedance of the power amplifier circuit 100 is increased as compared with input impedance of the power amplifier circuit 1000 according to the first comparative example illustrated in FIG. 14. FIG. 2 is a graph showing an example of a relationship between frequency and input impedance of each of the power amplifier circuit 1000 according to the first comparative example and the power amplifier circuit 100 according to the present embodiment. In FIG. 2, an X-axis indicates frequency of a high-frequency signal, and a Y-axis indicates input impedance. As illustrated in FIG. 2, in the power amplifier circuit 1000 according to the first comparative example, the input impedance decreases as the frequency of the high-frequency signal increases. That is, in the power amplifier circuit 1000, the input impedance has frequency characteristics, and is difficult to match a wide band, and thus broadband characteristics are inhibited. On the other hand, in the power amplifier circuit 100, the input impedance increases from a band where the frequency of the high-frequency signal is low toward 3.5 GHz. Even when 3.5 GHz is exceeded, the input impedance gradually decreases. That is, since the power amplifier circuit 100 can maintain high input impedance in a wide band, operation suitable for widening a band is enabled.

Figure 3:
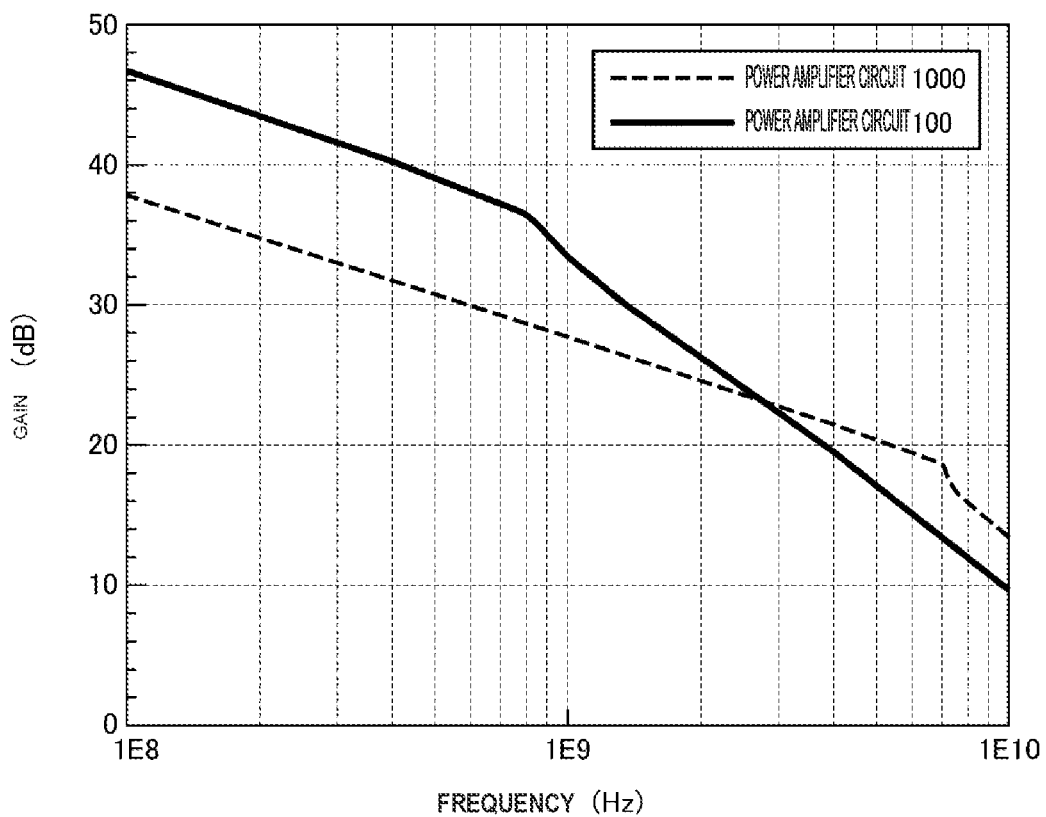
FIG. 3 is a graph showing an example of a relationship between frequency and gain of each of the power amplifier circuit according to the first comparative example and the power amplifier circuit according to the present embodiment.

Further, with reference to FIG. 3, a fact will be described that a gain of the power amplifier circuit 100 is increased as compared with a gain of the power amplifier circuit 1000 according to the first comparative example illustrated in FIG. 14. FIG. 3 is a graph illustrating an example of a relationship between frequency and gain of each of the power amplifier circuit 1000 according to the first comparative example and the power amplifier circuit 100 according to the present embodiment. In FIG. 3, an X-axis indicates frequency of a high-frequency signal, and a Y-axis indicates gain. As an example, a gain is a value calculated by dividing a maximum effective power gain by a maximum stable gain. As shown in FIG. 3, in the power amplifier circuit 1000 according to the first comparative example, a rate of decrease in gain is large in a band where the frequency of the high-frequency signal is about 0.8 GHz or larger. On the other hand, the gain of the power amplifier circuit 100 decreases at a constant rate in accordance with a change in the frequency of the high-frequency signal. Accordingly, the gain of the power amplifier circuit 1000 according to the first comparative example is lower than the gain of the power amplifier circuit 100 in a band in which the frequency of the high-frequency signal exceeds 2.5 GHz. That is, the power amplifier circuit 100 can increase a gain in a frequency band used in a communication device, as compared to the power amplifier circuit 1000 according to the first comparative example.

Figure 4:
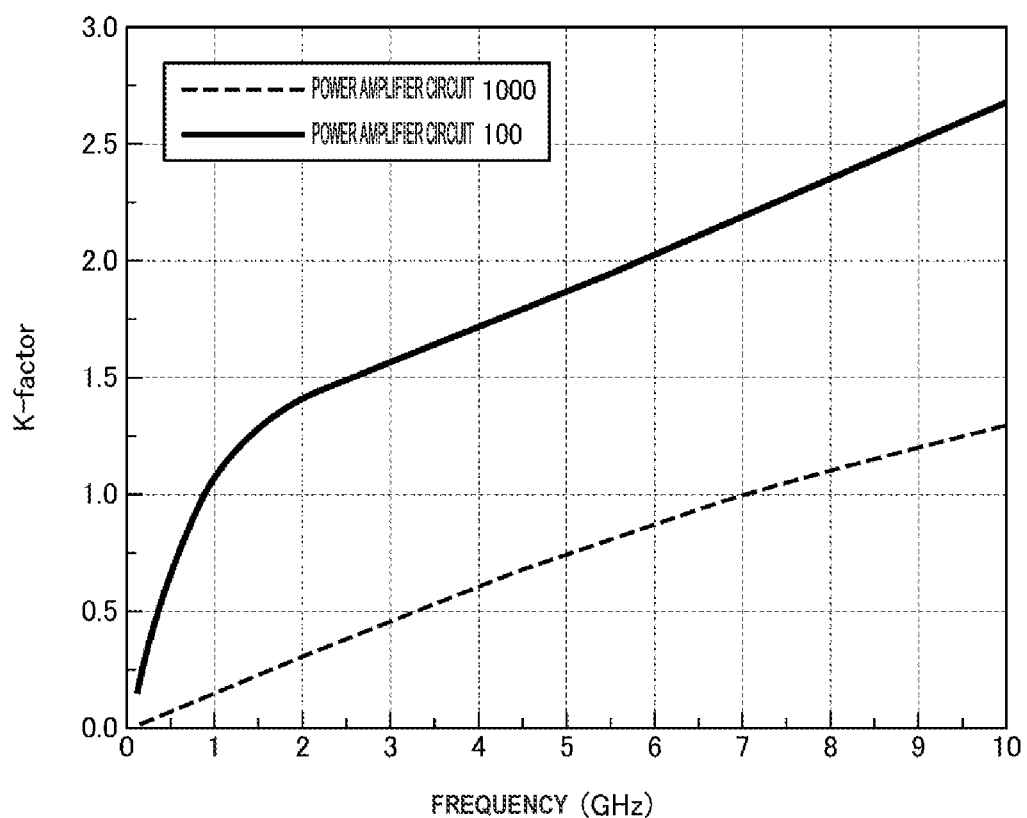
FIG. 4 is a graph showing an example of a relationship between frequency and stability of each of the power amplifier circuit according to the first comparative example and the power amplifier circuit according to the present embodiment.

Further, with reference to FIG. 4, a fact will be described that stability of the power amplifier circuit 100 is increased as compared with the power amplifier circuit 1000 according to the first comparative example illustrated in FIG. 14. FIG. 4 is a graph showing an example of a relationship between frequency and stability of each of the power amplifier circuit 1000 according to the first comparative example and the power amplifier circuit 100 according to the present embodiment. In FIG. 4, an X-axis indicates frequency of a high-frequency signal, and a Y-axis indicates stability index (for example, k-factor). The stability index is, for example, an index for determining a possibility of oscillation of the power amplifier circuit, and the power amplifier circuit is regarded as stable when K>1. As illustrated in FIG. 4, the power amplifier circuit 1000 according to the first comparative example is stable in a band in which the frequency of the high-frequency signal is higher than 7.0 GHz. On the other hand, the power amplifier circuit 100 is stable in a band in which the frequency is higher than 1.0 GHz. That is, the power amplifier circuit 100 can increase stability in a frequency band used in a communication device, as compared to the power amplifier circuit 1000 according to the first comparative example.

Figure 5:
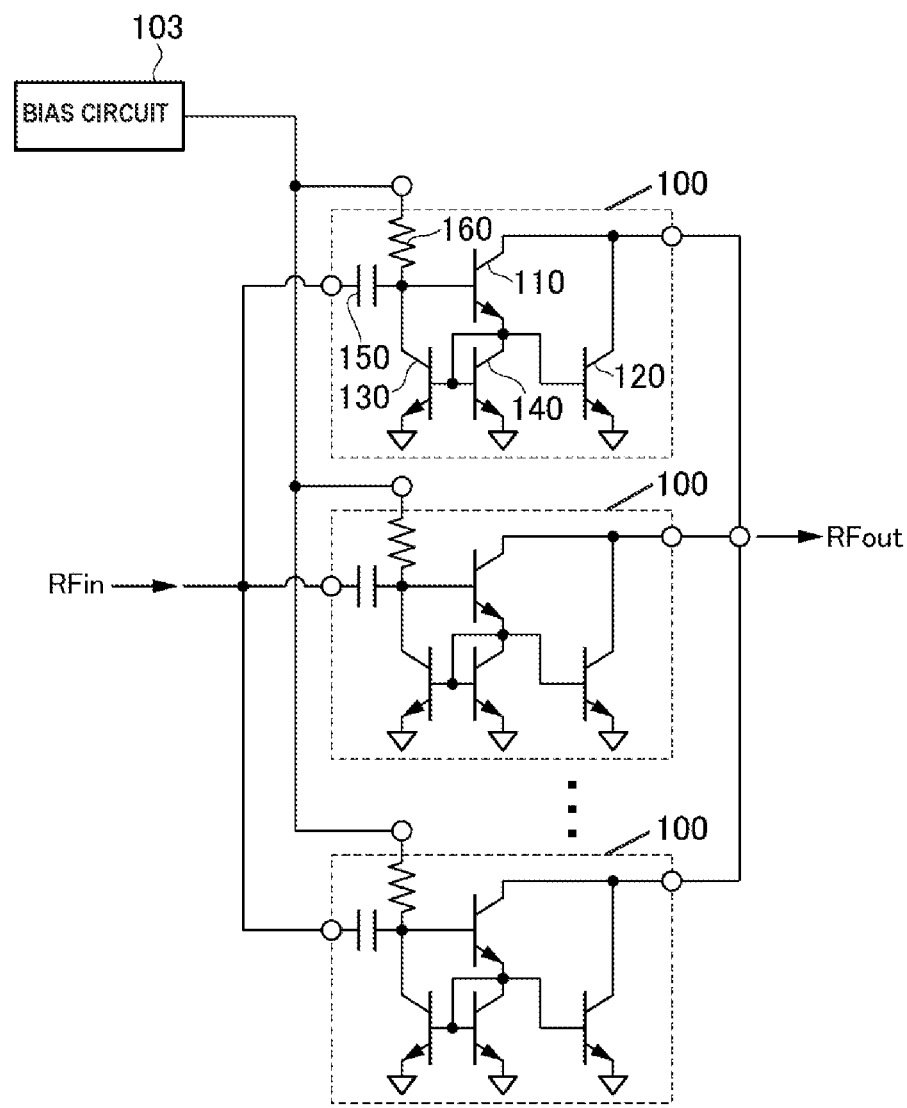
FIG. 5 is a diagram illustrating an example of a power amplifier circuit in which a plurality of power amplifier circuits is formed on the same semiconductor substrate.

Further, with reference to FIG. 5, a fact will be described that oscillation can be suppressed as compared with the power amplifier circuit 2000 according to the second comparative example illustrated in FIG. 15. FIG. 5 is a diagram illustrating an example of a power amplifier circuit in which a plurality of the power amplifier circuits 100 is formed on the same semiconductor substrate. Oscillation occurs in the power amplifier circuit 2000 according to the second comparative example illustrated in FIG. 15 as described above, but oscillation is suppressed in the plurality of power amplifier circuits 100 illustrated in FIG. 5 because isolation among the transistors 120 of the respective power amplifier circuits 100 is high. That is, in the plurality of power amplifier circuits 100 illustrated in FIG. 5, when a harmonic current amplified by the transistor 110 of the power amplifier circuit 100 that is predetermined flows back to a collector of the transistor 110 of another power amplifier circuit 100, the flowing back harmonic current is isolated by the transistor 110. Specifically, the current flowing back to the collector of the transistor 110 is terminated to the ground via the transistor 120 that is Darlington-connected to the transistor 110. Accordingly, the current flowing back to the collector of the transistor 110 can be suppressed from reaching a base of the transistor 110. That is, the harmonic current flowing back is not supplied again to the base of the transistor 110 of the predetermined power amplifier circuit 100. Thus, oscillation can be suppressed.

Referring back to FIG. 1, when the power amplifier circuit 100 is operating, and power consumption of the transistor 120 increases, a temperature of the transistor 120 increases, and therefore a rising voltage decreases, and the base current of the transistor 110 increases. Thus, a collector current of the transistor 120 increases. As described above, this leads to thermal runaway in the power amplifier circuit 3000 according to the third comparative example illustrated in FIG. 16. On the other hand, in the power amplifier circuit 100, when the temperature of the transistor 120 increases and the base current increases, the collector current of the transistor 130 increases. Thus, the base current of the transistor 110 can be pulled into the collector of the transistor 130 to decrease the base current of the transistor 110. Thus, thermal runaway can be suppressed in the power amplifier circuit 100.

First Modification

Figure 6:
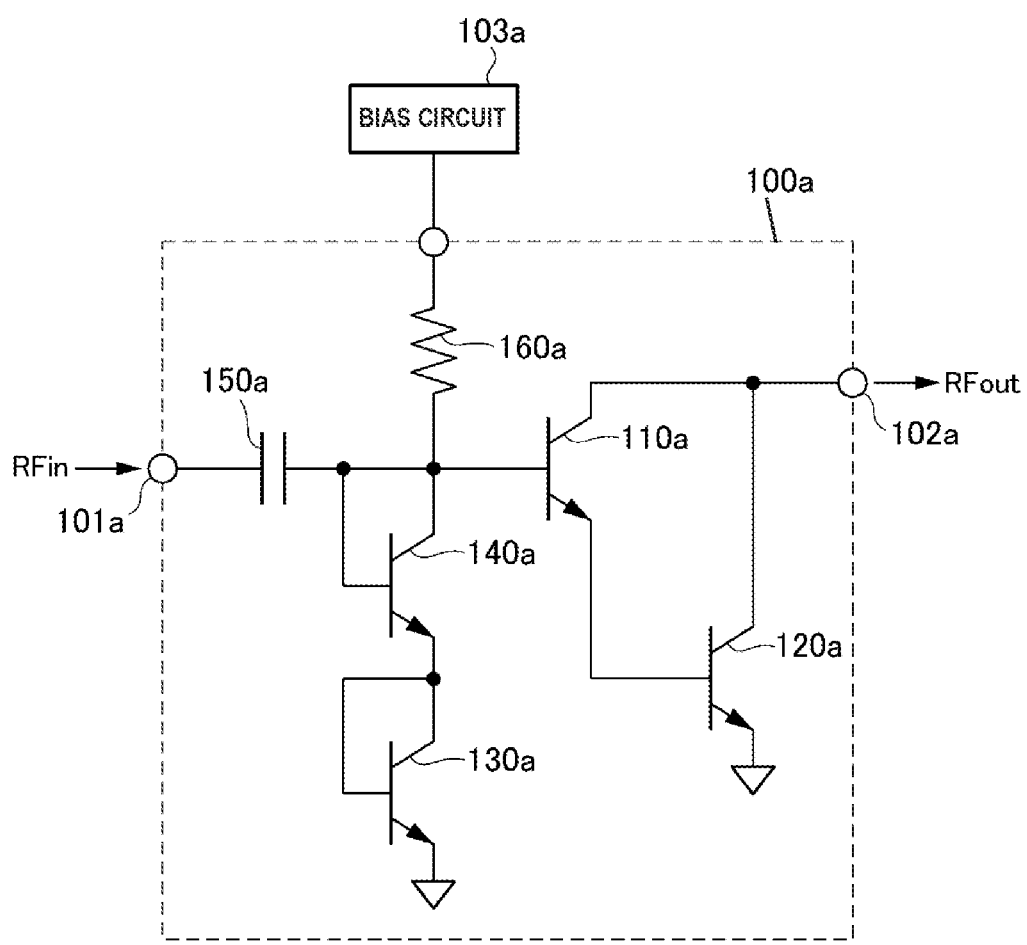
FIG. 6 is a configuration diagram illustrating an example of a configuration of a power amplifier circuit according to a first modification.

A power amplifier circuit 100*a* according to a first modification will be described with reference to FIG. 6. FIG. 6 is a configuration diagram illustrating an example of a configuration of the power amplifier circuit 100*a* according to the first modification. The power amplifier circuit 100*a* according to the first modification can suppress thermal runaway as compared to the power amplifier circuit 3000 according to the third comparative example illustrated in FIG. 16. As illustrated in FIG. 6, the power amplifier circuit 100*a* includes, for example, a transistor 110*a*, a transistor 120*a*, a transistor 130*a*, a transistor 140*a*, a capacitor 150*a*, and a resistor 160*a*.

The transistor 110*a* is a transistor that amplifies the input signal RFin. A base of the transistor 110*a* is connected to an input terminal 101*a* through the capacitor 150*a*. Additionally, the base is supplied with a bias current from a bias circuit 103*a* through the resistor 160*a*. An emitter of the transistor 110*a* is connected to a base of the transistor 120*a*. A collector of the transistor 110*a* is connected to a collector of the transistor 120*a*. Further, the collector of the transistor 110*a* may be connected to, for example, an output terminal 102*a*. In this manner, the transistor 110*a* can increase input impedance by amplifying the input signal RFin by using an emitter-follower circuit. Further, the transistor 110*a* is configured with the emitter-follower circuit, and can decrease output impedance, so that a voltage drop of a base current of the transistor 120*a* can be reduced.

The transistor 120*a* is a transistor that amplifies the input signal RFin amplified by the transistor 110*a* and outputs the output signal RFout. The base of the transistor 120*a* is connected to the emitter of the transistor 110*a*. The collector of the transistor 120*a* is connected to the output terminal 102*a*. An emitter of the transistor 120*a* may be connected to reference potential.

The transistor 130*a* and the transistor 140*a* are transistors for suppressing thermal runaway by pulling in a base current of the transistor 110*a*. In order to thermally couple to the transistor 120*a*, at least one of the transistor 130*a* and the transistor 140*a* is arranged on the semiconductor substrate same as the transistor 120*a*. In the transistor 130*a*, a base and a collector are connected to each other, and an emitter is connected to the reference potential. In the transistor 140*a*, a base and a collector are connected to the base of the transistor 110*a*. An emitter of the transistor 140*a* is connected to the collector of the transistor 130*a*.

Here, operation of the power amplifier circuit 100*a* will be described. In the transistor 120*a*, when power consumption increases, the temperature rises, and a rising voltage decreases. This lowers emitter potential of the transistor 110*a*. Accordingly, since a voltage between the base and the emitter of the transistor 110*a* increases, a base current increases. At this time, since the transistor 130*a* and the transistor 140*a* are thermally coupled to the transistor 120*a*, a temperature rise occurs similarly to the transistor 120a. Then, in each of the transistor 130a and the transistor 140a, emitter potential decreases, and a voltage between the base and the emitter increases. Accordingly, since the transistor 130a and the transistor 140a pull in the base current of the transistor 110a, the base current is reduced. Thus, the transistor 130a and the transistor 140a can suppress thermal runaway of the power amplifier circuit 100a.

Second Modification

Figure 7:
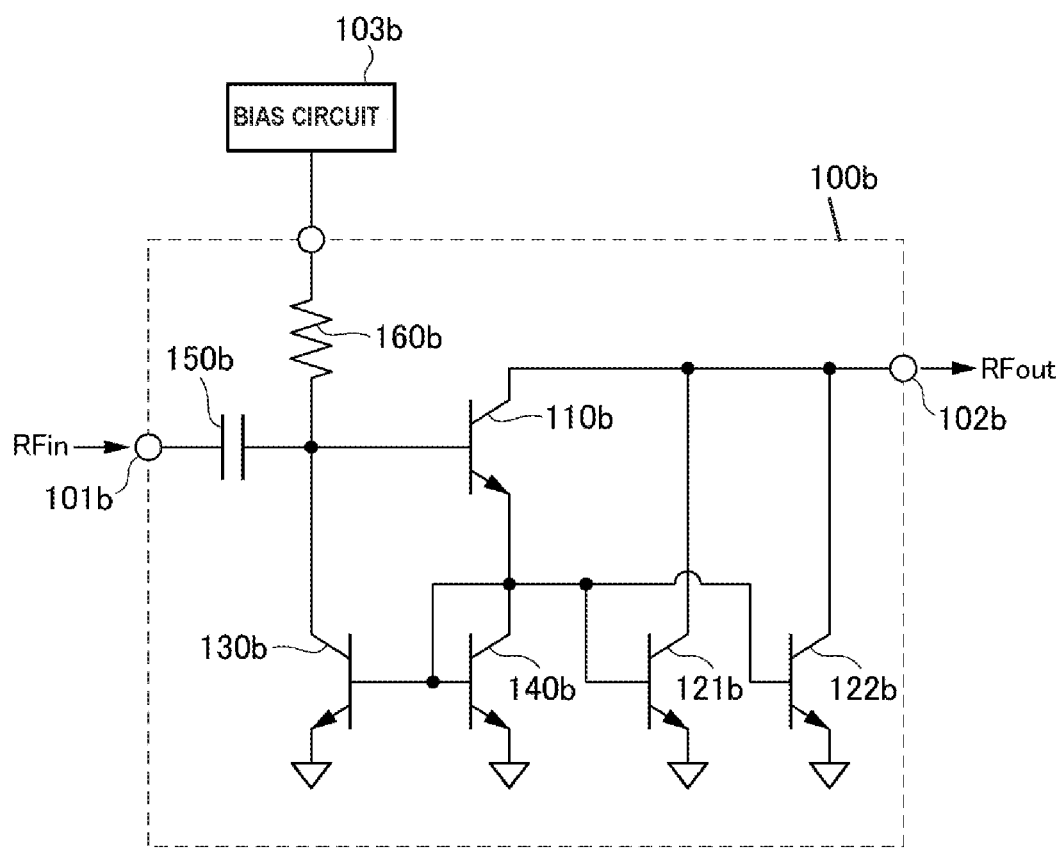
FIG. 7 is a configuration diagram illustrating an example of a configuration of a power amplifier circuit according to a second modification.

A power amplifier circuit 100b according to a second modification will be described with reference to FIG. 7. FIG. 7 is a configuration diagram illustrating an example of a configuration of the power amplifier circuit 100b according to the second modification. The power amplifier circuit 100b according to the second modification can be made small as compared to the power amplifier circuit 100 illustrated in FIG. 1.

As illustrated in FIG. 7, the power amplifier circuit 100b is obtained by replacing the transistor 120 of the power amplifier circuit 100 with a plurality of transistors 121b and 122b connected in parallel. In the transistors 121b and 122b, respective bases are connected to each other, respective collectors are connected to an output terminal 102b, and respective emitters are connected to reference potential. In the power amplifier circuit 100 illustrated in FIG. 1, connecting one set of the transistors 110, 130, and 140 to the single transistor 120 leads to an excessively large design, an increase in cost, and an increase in size. Then, as illustrated in FIG. 7, the power amplifier circuit 100b includes the plurality of transistors 121b and 122b, for obtaining the output signal RFout that is desirable. Accordingly, the power amplifier circuit can be reduced in size and manufacturing costs can be reduced. Note that, although FIG. 7 illustrates that the two transistors 121b and 122b are connected in parallel, the number of transistors connected in parallel is not limited.

Third Modification

Figure 8:
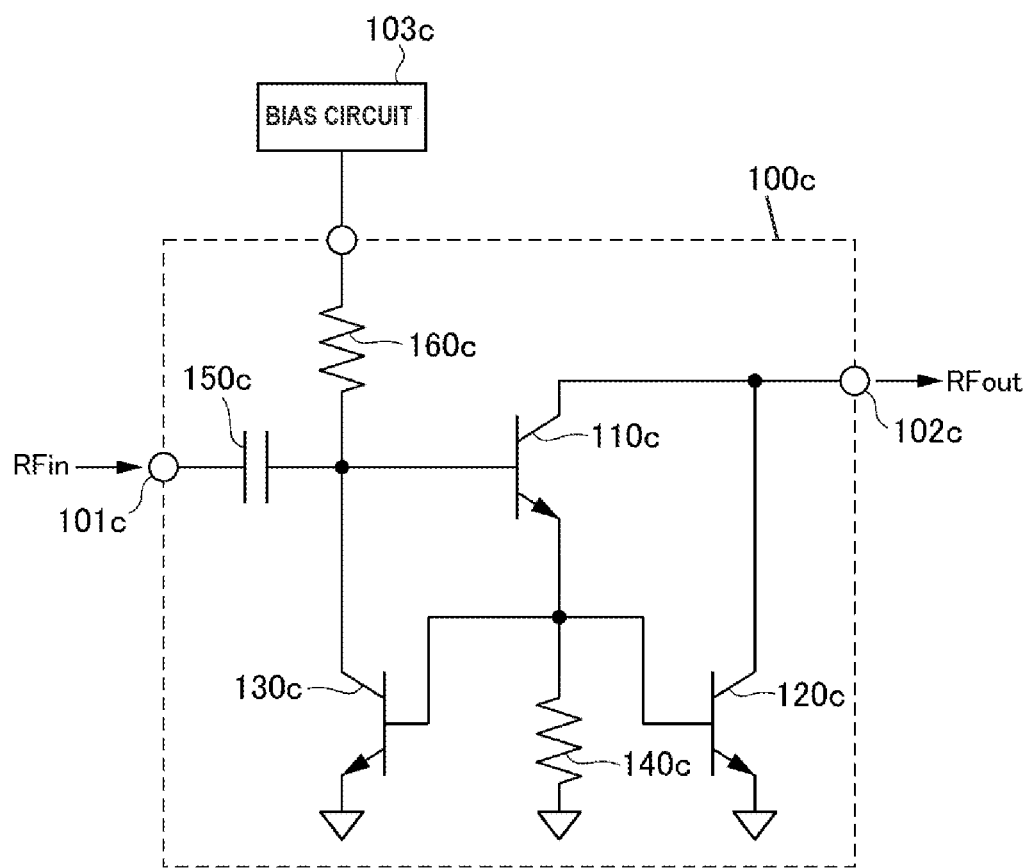
FIG. 8 is a configuration diagram illustrating an example of a configuration of a power amplifier circuit according to a third modification.

A power amplifier circuit 100c according to a third modification will be described with reference to FIG. 8. FIG. 8 is a configuration diagram illustrating an example of a configuration of the power amplifier circuit 100c according to the third modification. The power amplifier circuit 100c according to the third modification can be designed more easily than the power amplifier circuit 100 illustrated in FIG. 1. As illustrated in FIG. 8, the power amplifier circuit 100c is obtained by replacing the transistor 140 of the power amplifier circuit 100 with a resistor 140c. A resistance value of the resistor 140c is determined so that a desired current flows through the emitter of the transistor 110c.

Fourth Modification

Figure 9A:
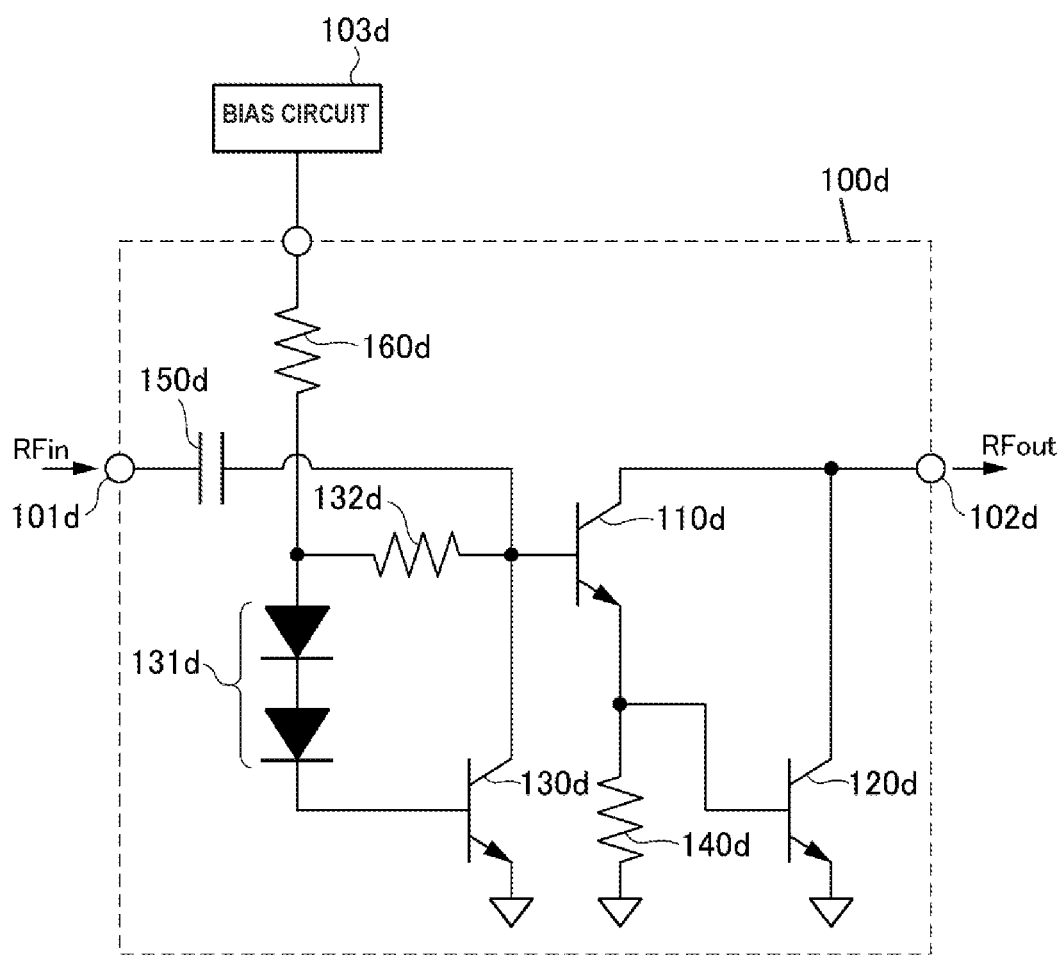
FIG. 9A is a configuration diagram illustrating an example of a configuration of a power amplifier circuit according to a fourth modification.
Figure 9B:
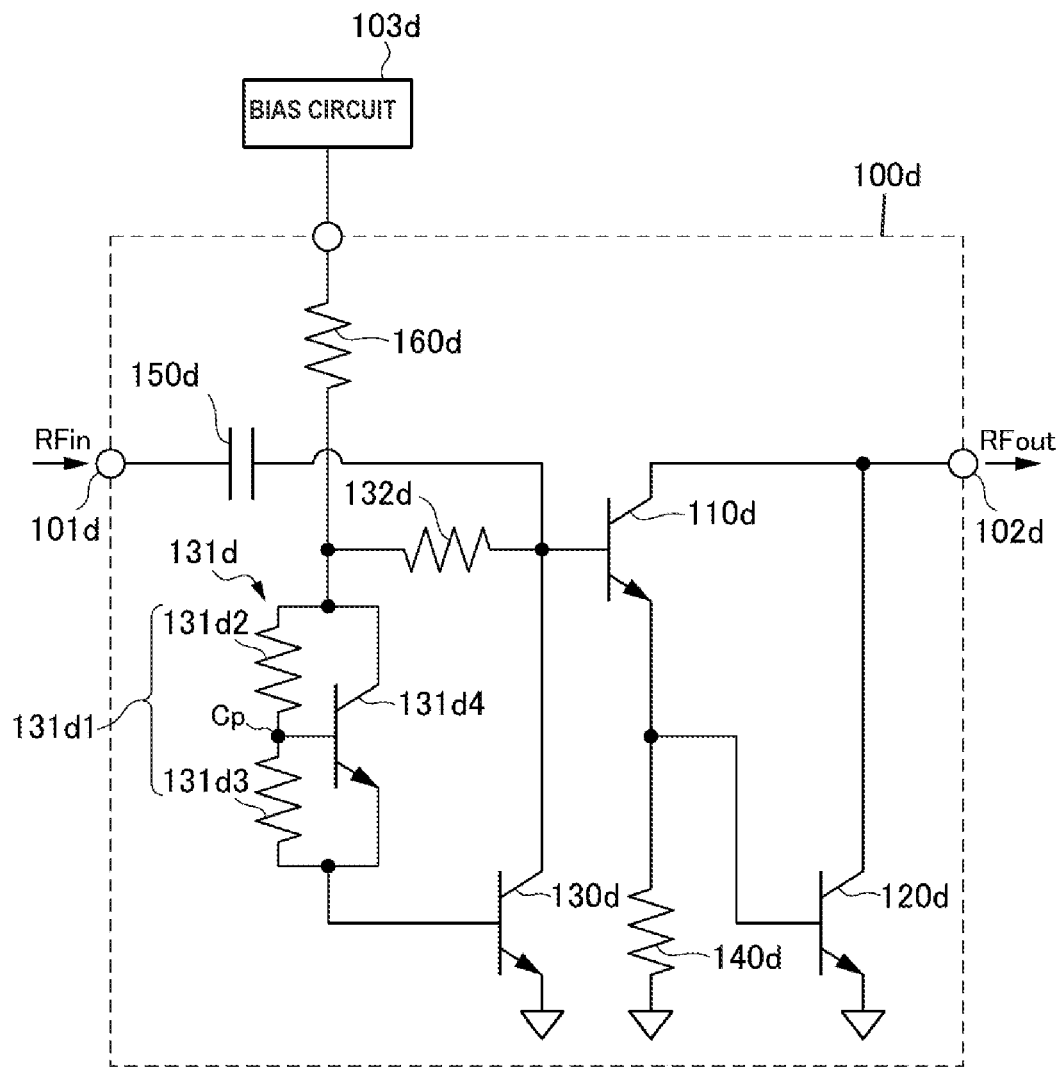
FIG. 9B is a configuration diagram illustrating an example of a configuration of a power amplifier circuit according to the fourth modification.

A fourth modification of the power amplifier circuit 100 will be described with reference to FIG. 9A and FIG. 9B. FIG. 9A, and FIG. 9B are each a configuration diagram illustrating an example of a configuration of a power amplifier circuit 100d according to the fourth modification. As compared to the power amplifier circuit 100 illustrated in FIG. 1, the power amplifier circuit 100d according to the fourth modification has a configuration in which a bias current can be supplied to the transistor 120, particularly in class-B or class-C operation. The power amplifier circuit 100d includes, for example, a transistor 110d, a transistor 120d, a transistor 130d, a constant voltage circuit 131d, a resistor 132d, a resistor 140d, a capacitor 150d, and a resistor 160d. Here, since the transistor 110d, the transistor 120d, the capacitor 150d, and the resistor 160d are the same as the transistor 110, the transistor 120d, the capacitor 150, and the resistor 160 of the power amplifier circuit 100, description thereof will be omitted.

The transistor 130d has a collector connected to a base of the transistor 110d, an emitter connected to reference potential, and a base connected to the base of the transistor 110d through the constant voltage circuit 131d and the resistor 132d. The constant voltage circuit 131d is an electric device that supplies a predetermined voltage. As illustrated in the FIG. 9A, the constant voltage circuit 131d may be configured, for example, in which two diodes are connected in series. Further, as illustrated in FIG. 9B, the constant voltage circuit 131d may be configured to include, for example, a voltage-dividing circuit 131d1 having a resistor 131d2 and a resistor 131d3 connected in series, and a transistor 131d4 having a base connected to a connection point Cp between the resistor 131d2 and the resistor 131d3. For example, one end of the voltage-dividing circuit 131d1 is connected to the base of the transistor 110d through the resistor 132d, and the other end is connected to the base of the transistor 130d. The transistor 131d4 has a base connected to the connection point Cp between the resistor 131d2 and the resistor 131d3, a collector connected to the base of the transistor 110d through the resistor 132d, and an emitter connected to the base of the transistor 130d. Note that, the constant voltage circuit 131d may be, for example, a direct-current power supply, a transistor in which a base and a collector are connected to each other, or a transistor in which a base and an emitter are connected to each other, and is not particularly limited. One end of the resistor 132d is connected to the base of the transistor 110d, and the other end is connected to the constant voltage circuit 131d. The resistor 140d is a resistive element having one end connected to an emitter of the transistor 110d, and the other end connected to the reference potential. The resistor 140d is a resistive element for increasing an emitter current of the transistor 110d. That is, the resistor 140d can increase input impedance of the transistor 110d. The resistor 140d may be, for example, a transistor. One end of the resistor 160d is connected to a bias circuit 103d, and the other end is connected to the base of the transistor 110d through the resistor 132d.

Here, operation of the power amplifier circuit 100d will be described. In the power amplifier circuit 100d, when the class-B or class-C operation is performed, it is suitable to set a bias equal to or lower than an operating point to the transistor 120d so that the transistor 120d does not allow a current to flow. In the power amplifier circuit 100 illustrated in FIG. 1, since the base of the transistor 120 and the base of the transistor 130 are connected to each other without necessarily a transistor interposed therebetween, when a current does not flow through the transistor 120, a current cannot flow through the transistor 130, and a bias equal to or lower than an operating point cannot be set to the transistor 120. On the other hand, in the power amplifier circuit 100d, a bias equal to or lower than the operating point can be set to the transistor 120d with reference to a voltage of the transistor 130d and a voltage of the constant voltage circuit 131d.

For example, when the class-C operation is performed, no current is allowed to flow through the transistor 120d at all. That is, in the class-C operation, base potential of the transistor 120d needs to be equal to or lower than a rising voltage. For example, in the power amplifier circuit 100 illustrated in FIG. 1, since the base of the transistor 120 and the base of the transistor 130 are connected to each other without necessarily a transistor interposed therebetween, base potential of the transistor 120 does not become equal to or lower than a rising voltage. On the other hand, in the power amplifier circuit 100d, for example, the transistor 130d and the constant voltage circuit 131d make a triple base-emitter voltage (hereinafter referred to as "3Vbe"). Then, 3Vbe is dropped by the resistor 132d and supplied to the transistor 110d. Thus, in the power amplifier circuit 100d, a bias lower than a one time base-emitter voltage Vbe can be set to the transistor 120d that is Darlington-connected to the transistor 110d.

Fifth Modification

Figure 10:
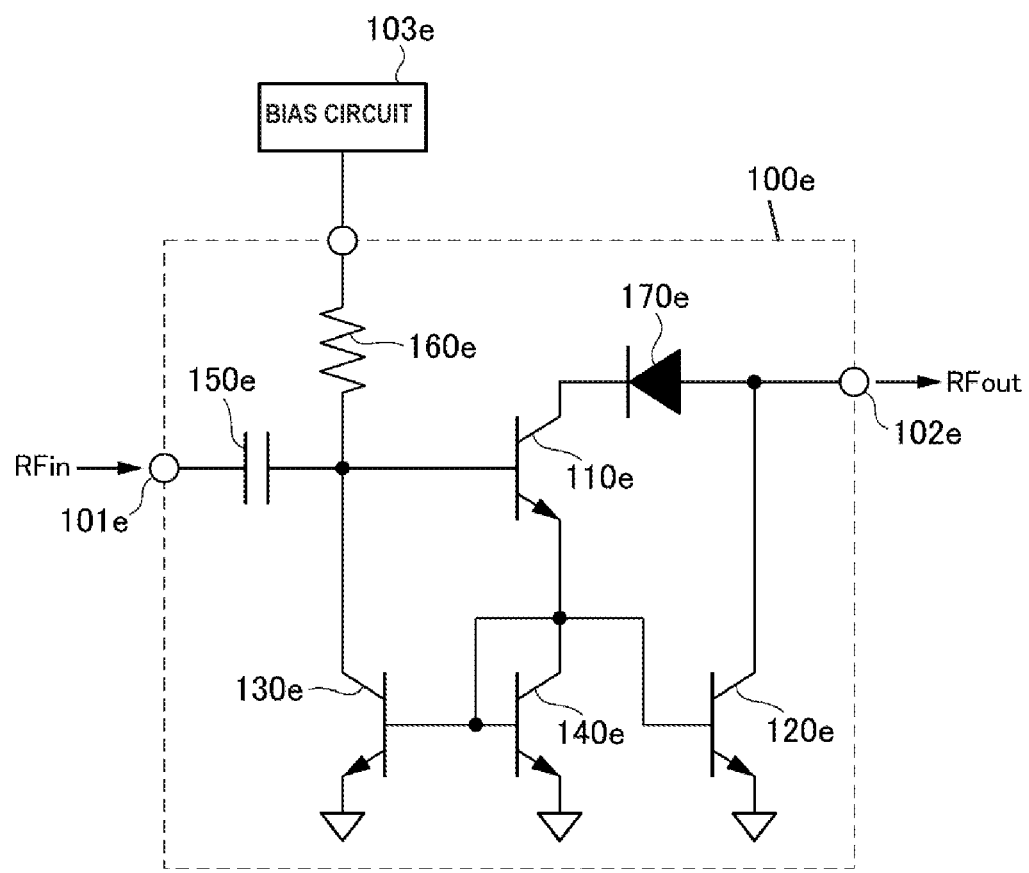
FIG. 10 is a configuration diagram illustrating an example of a configuration of a power amplifier circuit according to a fifth modification.

A fifth modification of the power amplifier circuit 100 will be described with reference to FIG. 10. FIG. 10 is a configuration diagram illustrating an example of a configuration of a power amplifier circuit 100e according to the fifth modification. In the power amplifier circuit 100e according to the fifth modification, a current from a transistor 110e to an output terminal 102 can be blocked. In the power amplifier circuit 100, when the input signal RFin is large, collector potential of the transistor 120 is close to 0 V, and base potential of the transistor 110 becomes higher, and thus, a current may flow from the base of the transistor 110 to the output terminal 102e.

On the other hand, the power amplifier circuit 100e includes a diode 170e having a cathode connected to a collector of the transistor 110e, and an anode connected to a collector of a transistor 120e. That is, in the power amplifier circuit 100e, when a current flows from a base of the transistor 110e to the output terminal 102e, the diode 170e is in a reverse-biased state, so that no current flows through the output terminal 102e. Thus, the operation of the power amplifier circuit 110e is stabilized.

Sixth Modification

Figure 11:
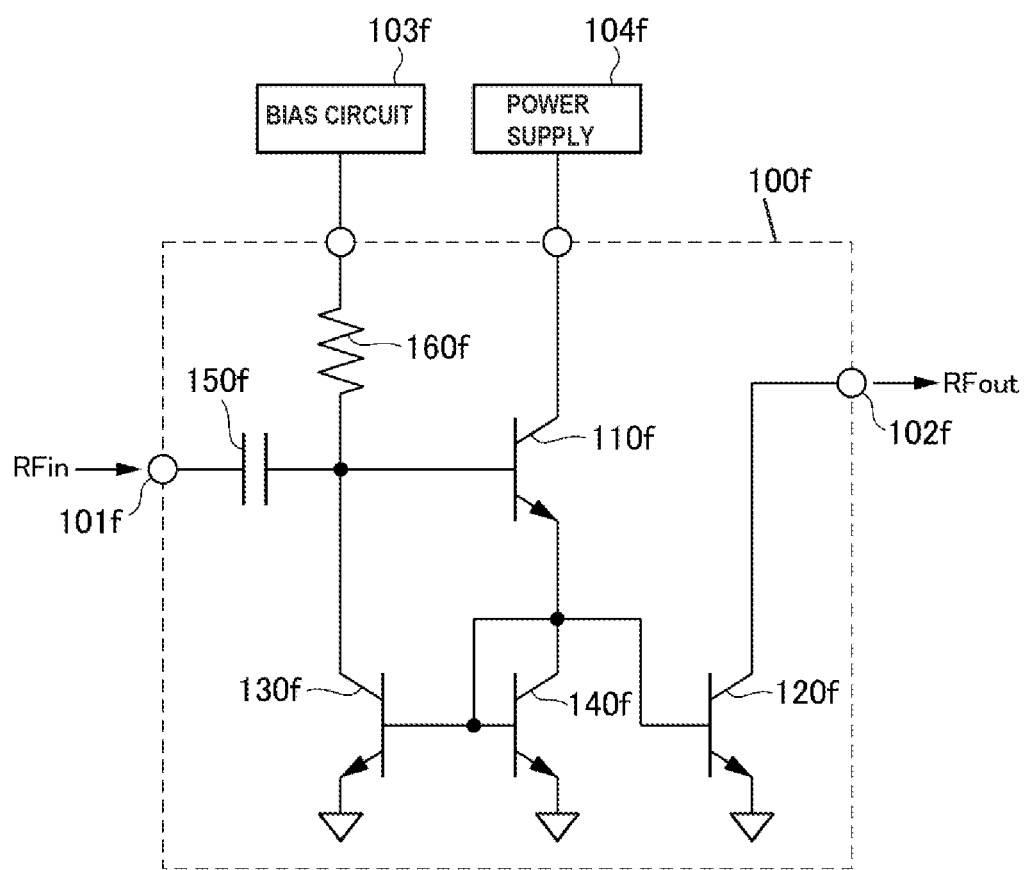
FIG. 11 is a configuration diagram illustrating an example of a configuration of a power amplifier circuit according to a sixth modification.

A sixth modification of the power amplifier circuit 100 will be described with reference to FIG. 11. FIG. 11 is a configuration diagram illustrating an example of a configuration of a power amplifier circuit 100f according to the sixth modification. The power amplifier circuit 100f according to the sixth modification can block a current from a transistor 110f to an output terminal 102f. While the collector of the transistor 110 is connected to the output terminal 102f in the power amplifier circuit 100, a collector of the transistor 110f in the power amplifier circuit 110f is not connected to the output terminal 102 but is connected to an external power supply 104f as illustrated in FIG. 11. That is, in the power amplifier circuit 100f, a signal is not taken out from the collector of the transistor 100f.

Seventh Modification

Figure 12:
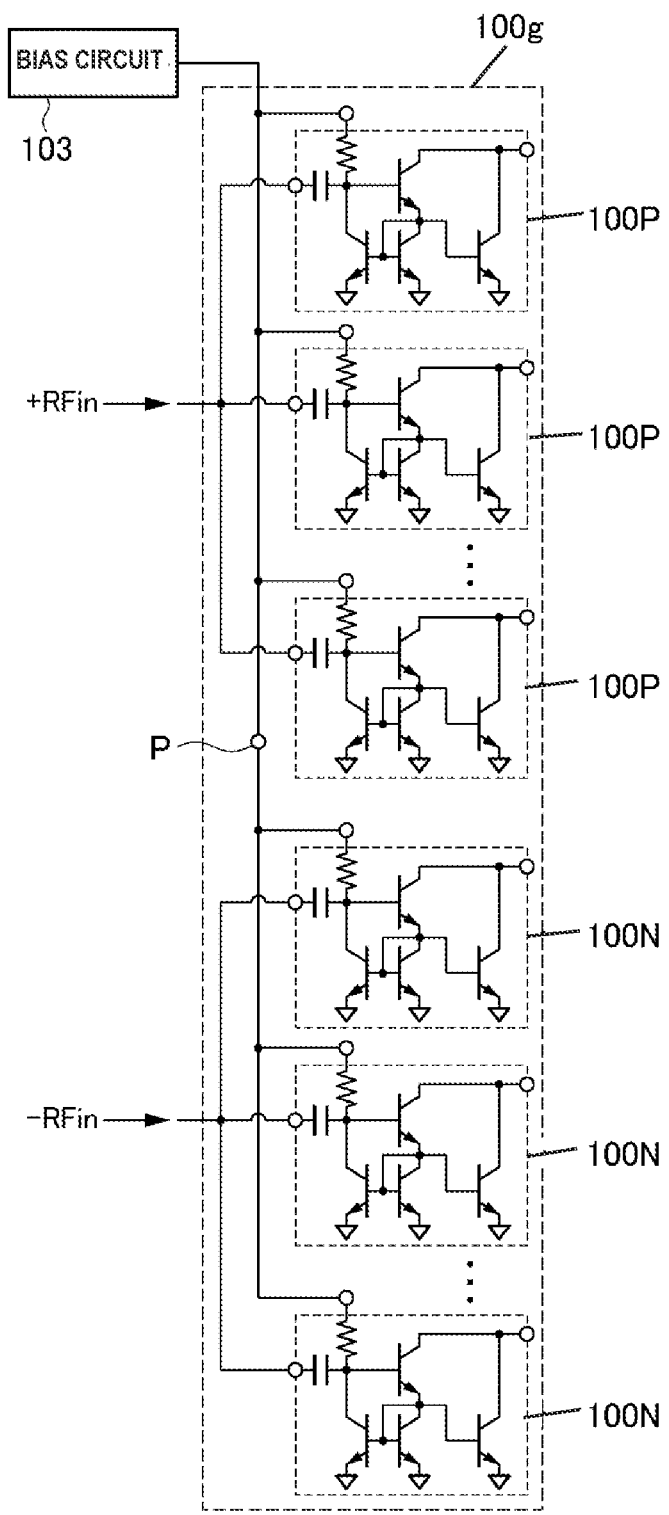
FIG. 12 is a configuration diagram illustrating an example of a configuration of a power amplifier circuit according to a seventh modification.

A seventh modification of the power amplifier circuit 100 will be described with reference to FIG. 12. FIG. 12 is a configuration diagram illustrating an example of a configuration of a power amplifier circuit 100g according to the seventh modification. The power amplifier circuit 100g according to the seventh modification is a differential power amplifier circuit that includes a power amplifier circuit 100P and a power amplifier circuit 100N. A plurality of the power amplifier circuits 100P may be provided, for example, and an input signal +RFin having a predetermined phase is input thereto. On the other hand, a plurality of the power amplifier circuits 100N may be provided, for example, and an input signal −RFin having a reverse phase to that of the input signal +RFin is input thereto. Note that, for example, the "reverse phase" has a phase difference from 135° to 225° from the input signal +RFin. This makes it possible to achieve widening the band of the power amplifier circuit 100g. Further, since the power amplifier circuit 100g is configured differentially, it is optional to provide a decoupling capacitor at a point "P" in FIG. 12. Accordingly, it is possible to avoid an increase in size and a delay due to provision of a decoupling capacitor. Furthermore, in the power amplifier circuit 100g, for example, when a baseband signal for controlling base potential of a peak amplifier of a Doherty amplifier in accordance with an envelope curve of a high-frequency signal is input from the bias circuit 103, it is possible to avoid a delay caused by a decoupling capacitor.

Arrangement

Figure 13:
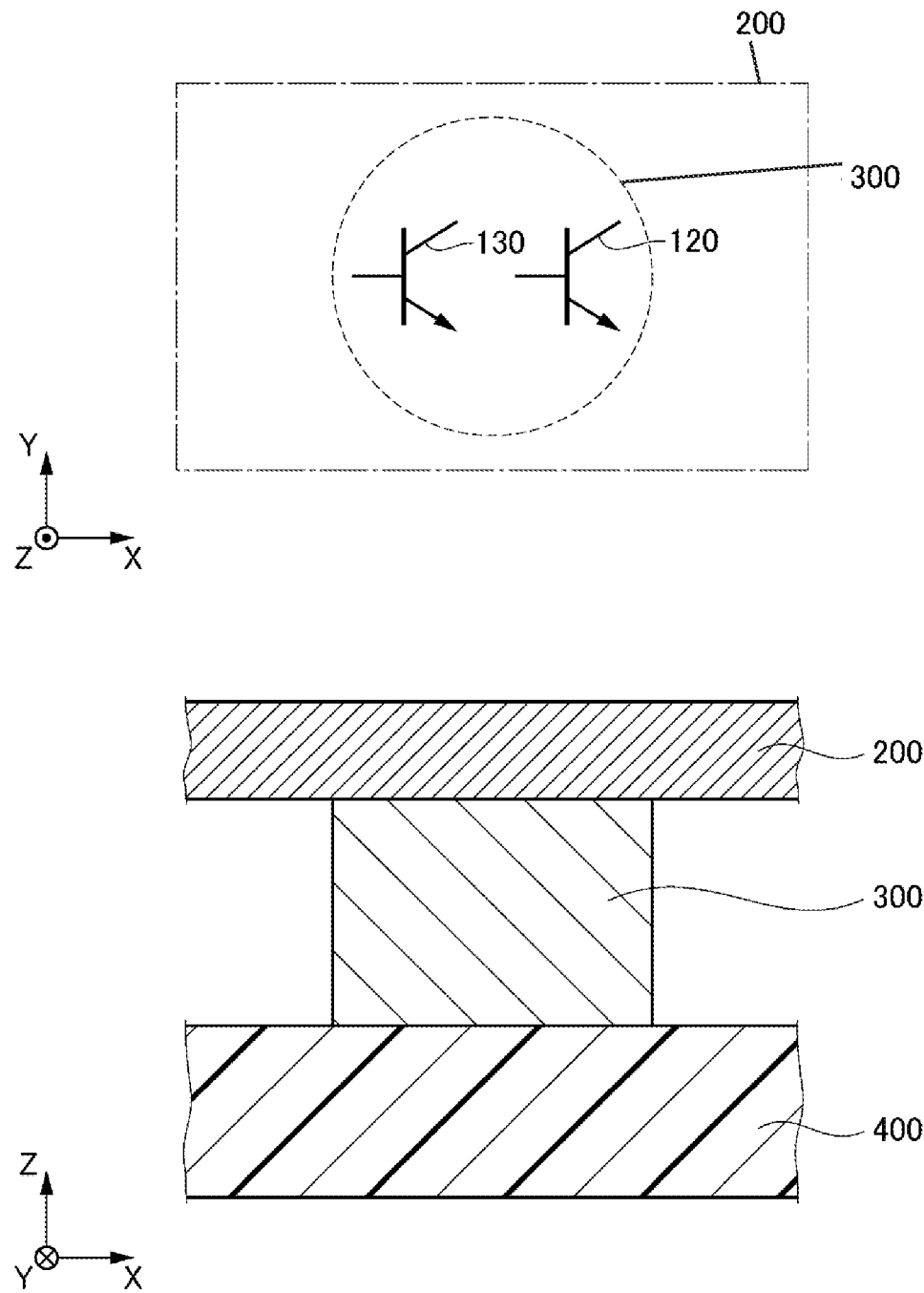
FIG. 13 is a configuration diagram illustrating an example of an arrangement of components of the power amplifier circuit according to the present embodiment.

The arrangement of the components of the power amplifier circuit 100 will be described with reference to FIG. 13. FIG. 13 is a configuration diagram illustrating an example of the arrangement of the components of the power amplifier circuit 100 according to the present embodiment. In FIG. 13, for example, an X-axis is an axis along one direction on a main surface of a semiconductor substrate 200, a Y-axis is an axis orthogonal to the X-axis on the main surface of the semiconductor substrate 200, and a Z-axis is an axis orthogonal to the X-axis and the Y-axis. As illustrated in FIG. 13, the transistors constituting the power amplifier circuit 100 are formed on the semiconductor substrate 200. The semiconductor substrate 200 is connected to a predetermined substrate 400 through, for example, a bump 300. Since the semiconductor substrate 200 is formed of a material different from that of the bump 300, a thermal expansion coefficient of the semiconductor substrate 200 is different from a thermal expansion coefficient of the bump 300. Thus, the semiconductor substrate 200 receives a stress from the bump 300 that expands and contracts in accordance with a change in heat. That is, the transistors constituting the power amplifier circuit 100 formed on the semiconductor substrate 200 receive the stress from the bump 300. Then, when a difference occurs in the stress received among the transistors constituting the power amplifier circuit 100, a difference occurs in characteristics among the transistors, and thus the operation of the power amplifier circuit 100 becomes unstable. Thus, in the power amplifier circuit 100, arrangement is performed such that at least a part of the transistor 120 at a final stage and at least a part of the transistors 130 and 140 for input impedance adjustment overlap the bump in an XY-plane. Accordingly, the transistor 120 at the final stage and at least one of the transistors 130 and 140 receive an equivalent stress from the bump 300, and thus the operation of the power amplifier circuit 100 is stabilized.

Specifically, in the power amplifier circuit 100, when heat is generated in the transistor 120, the semiconductor substrate 200 expands, and thus the transistor 120 receives a stress from the bump 300. At this time, a base-emitter voltage of the transistor 120 changes in accordance with the stress. In the power amplifier circuit 100, since the transistor 120, and the transistors 130 and 140 overlap the same bump 300 in the XY-plane, the transistors 130 and 140 receive stress equivalent to that of the transistor 120. Accordingly, a change in a base-emitter voltage of each of the transistors 130 and 140 is equivalent to the change in the base-emitter voltage of the transistor 120. Accordingly, the operation of the power amplifier circuit 100 is stabilized even when the stress changes in accordance with a change in heat.

More specifically, in the power amplifier circuit 100, it is desirable that all of the transistors 120, 130, and 140 are arranged so as to overlap the same bump 300. Accordingly, the operation of the power amplifier circuit 100 is further stabilized.

Further, in the power amplifier circuit 100d, it is desirable that all the transistor 120d, the transistor 130d, and the constant voltage circuit 131d are arranged so as to overlap the same bump 300. Accordingly, the operation of the power amplifier circuit 100d is further stabilized.

Further, in the power amplifier circuit 100, the transistor 110 and the transistor 120 may be arranged so as to overlap the same bump 300, and in the power amplifier circuit 100d, the transistor 110d and the transistor 120d may be arranged so as to overlap the same bump 300. Accordingly, the operation of the power amplifier circuits 100 and 100d are further stabilized.

SUMMARY

The power amplifier circuit 100 includes the transistor 110 (a first transistor) having the base supplied with a high-frequency signal through the capacitor 150, and supplied with a bias current through the resistor 160 (a resistive element), the transistor 120 (a second transistor) having the base connected to the emitter of the transistor 110 (first transistor), and the collector connected to the output terminal 102, and the transistor 130 (a third transistor) having the collector connected to the base of the transistor 110 (first transistor), and the emitter connected to the reference potential (for example, a ground), wherein the transistor 130 (third transistor) is provided such that a current flowing through the collector of the transistor 130 (third transistor) increases in accordance with an increase in a current flowing through the emitter of the transistor 110 (first transistor). Thus, the power amplifier circuit 100 can realize high input impedance. In addition, since the power amplifier circuit 100 can increase the input impedance, the capacitor 150 can be reduced in size, so that the circuit can be reduced in size.

Further, the power amplifier circuit 100 further includes the element having the one end connected to the emitter of the transistor 110 (first transistor) and the other end is connected to the reference potential, in order to operate the transistor 110 (first transistor) as the emitter-follower. Accordingly, since the power amplifier circuit 100 can increase the emitter current of the transistor 110 as the emitter-follower, the input impedance of the transistor 110 can be increased.

Further, the element of the power amplifier circuit 100 is the transistor 140 (a fourth transistor), the collector of the transistor 140 (fourth transistor) is connected to the emitter of the transistor 110 (first transistor), and the emitter of the transistor 140 (fourth transistor) is connected to the reference potential. Accordingly, since the power amplifier circuit 100 can increase the emitter current of the transistor 110, the input impedance can be increased by operating the transistor 110 as the emitter-follower.

Additionally, the element of the power amplifier circuit 100c is the resistor 140c (a first resistive element). This allows the power amplifier circuit 100c to increase the emitter current of the transistor 110 of the emitter-follower, thereby increasing the input impedance of the transistor 110.

Additionally, the power amplifier circuit 100d further includes the resistor 132d (a second resistive element) having the one end connected to the base of the transistor 110d (first transistor), and the constant voltage circuit 131d having the one end connected to the other end of the resistor 132d (second resistive element) and the other end connected to the base of the transistor 130d (third transistor). Thus, even when the class-B or class-C operation is performed, the power amplifier circuit 100d can set bias to the transistor 120d with reference to the voltage of the transistor 130d and the voltage of the constant voltage circuit 131d.

Further, the constant voltage circuit 131d of the power amplifier circuit 100d is at least one diode having the anode connected to the other end of the resistor 132d (second resistive element) and the cathode connected to the base of the transistor 130d (third transistor). Thus, a constant voltage source can be easily realized.

Further, the constant voltage circuit 131d of the power amplifier circuit 100d includes the voltage-dividing circuit 131d configured with the resistor 131d2 (a third resistive element), and the resistor 131d3 (a fourth resistive element), and having the one end connected to the other end of the resistor 132d (second resistive element), and the other end connected to the base or the gate of the transistor 130d (third transistor), and the transistor 131d4 (a fifth transistor) having the collector or the drain connected to the other end of the resistor 132d (second resistive element), the base or the gate connected to the connection point Cp between the resistor 131d2 (third resistive element) and the resistor 131d3 (fourth resistive element), and the emitter or the source connected to the base or the gate of the transistor 130d (third transistor). Thus, a constant voltage source can be easily realized.

Further, the diode 131d of the power amplifier circuit 100d includes a first diode having a cathode connected to the base of the transistor 130 (third transistor), and a second diode having a cathode connected to an anode of the first diode, and an anode connected to the other end of the resistor 132d (second resistive element). Thus, a constant voltage source can be easily realized.

Further, the base of the transistor 130 (third transistor) of the power amplifier circuit 100 is connected to the base of the transistor 120 (second transistor). Accordingly, in the power amplifier circuit 100, since the base current of the transistor 110 can be taken in, the input impedance of the transistor 110 can be increased. Further, since the emitter current of the transistor 110 is reduced, the base current of the transistor 120 is reduced, and thermal runaway is suppressed.

Further, the power amplifier circuit 100e further includes the diode 170e (a third diode) having a cathode connected to the collector or a drain of the transistor 110e (first transistor), and an anode connected to the collector of the transistor 120e (second transistor). Accordingly, in the power amplifier circuit 100e, even when the input signal RFin is large, a current does not flow from the base of the transistor 110e to the output terminal 102e, and thus the operation of the circuit is stabilized.

Further, the collector of the transistor 110f (first transistor) of the power amplifier circuit 100f is connected to the external power supply 104f (a bias power supply). Thus, the power amplifier circuit 100f can block a current from the transistor 110f to the output terminal 102f.

Further, the transistor 120 (second transistor) of the power amplifier circuit 100b includes the plurality of transistors 121b and 122b connected in parallel. Accordingly, it is possible to reduce in size of the power amplifier circuit 100b and manufacturing costs.

Further, the transistors 110 to 110d, the transistors 120 to 120d, and the transistors 130 to 130d of the respective power amplifier circuits 100 to 100d are bipolar transistors. Accordingly, the power amplifier circuits 100 to 100d can increase the input impedance of the transistors 110 to 110d, respectively.

In addition, the power amplifier circuit 100 is formed such that at least a part of the transistor 120 (second transistor) and at least a part of the transistor 130 (third transistor) formed on the semiconductor substrate 200 overlap the predetermined bump 300 connecting the semiconductor substrate 200 and the predetermined substrate 400 in plan view. Accordingly, at least one of the transistor 120 at the final stage and the transistor 130 receive an equivalent stress from the bump 300, and thus the operation of the power amplifier circuit 100 is stabilized.

Further, the power amplifier circuit 100g is a differential amplifier circuit that includes the power amplifier circuit 100p (a first power amplifier circuit) supplied with the input signal +RFin (a first harmonic signal) having a predetermined phase, and the power amplifier circuit 100N (a second power amplifier circuit) supplied with the input signal −RFin (a second harmonic signal) having a reverse phase to that of the input signal +RFin. Accordingly, since it is optional to provide a decoupling capacitor, an increase in size and a delay caused by providing a decoupling capacitor can be avoided.

The above-described embodiments are intended to facilitate understanding of the present disclosure, and are not intended to limit interpretation of the present disclosure. The present disclosure may be modified or improved without necessarily departing from the gist thereof, and equivalents thereof are also included in the present disclosure. That is, appropriate design modifications to the embodiments by those skilled in the art are also included in the scope of the present disclosure as long as they have the features of the present disclosure. The elements included in the embodiments and the arrangement or other factors thereof are not limited to those illustrated, and can be appropriately changed.

What is claimed is:

1. A power amplifier circuit, comprising:
   a first transistor comprising a base or a gate that is configured to receive a high-frequency signal through a capacitor, and further configured to receive a bias through a resistive circuit element;
   a second transistor comprising a base or a gate that is connected to an emitter or a source of the first transistor, and a collector or a drain that is connected to an output terminal; and
   a third transistor comprising a collector or a drain that is connected to the base or the gate of the first transistor, and an emitter or a source that is connected to a reference potential,
   wherein a current flowing through the collector or the drain of the third transistor increases when a current flowing through the collector or the drain of the second transistor increases.

2. The power amplifier circuit according to claim 1, further comprising:
   a circuit element having a first end that is connected to the emitter or the source of the first transistor, and a second end that is connected to the reference potential so as to increase a current of the emitter or the source of the first transistor.

3. The power amplifier circuit according to claim 2,
   wherein the circuit element comprises a fourth transistor,
   wherein a collector or a drain of the fourth transistor is connected to the emitter or the source of the first transistor, and
   wherein an emitter or a source of the fourth transistor is connected to the reference potential.

4. The power amplifier circuit according to claim 2,
   wherein the circuit element comprises a first resistive circuit element.

5. The power amplifier circuit according to claim 1, further comprising:
   a second resistive circuit element having a first end that is connected to the base or the gate of the first transistor; and
   a constant voltage circuit having a first end that is connected to a second end of the second resistive circuit element, and a second end that is connected to a base or a gate of the third transistor.

6. The power amplifier circuit according to claim 5,
   wherein the constant voltage circuit comprises at least one diode having an anode that is connected to the second end of the second resistive circuit element, and a cathode that is connected to the base or the gate of the third transistor.

7. The power amplifier circuit according to claim 5,
   wherein the constant voltage circuit comprises:
   a voltage-dividing circuit comprising a third resistive circuit element and a fourth resistive circuit element, the voltage-dividing circuit having a first end that is connected to the second end of the second resistive circuit element, and a second end that is connected to the base or the gate of the third transistor; and
   a fifth transistor comprising a collector or a drain that is connected to the second end of the second resistive circuit element, a base or a gate that is connected to a connection point between the third resistive circuit element and the fourth resistive circuit element, and an emitter or a source that is connected to the base or the gate of the third transistor.

8. The power amplifier circuit according to claim 1,
   wherein a base or a gate of the third transistor is connected to the base or the gate of the second transistor.

9. The power amplifier circuit according to claim 1, further comprising:
   a third diode having a cathode that is connected to a collector or a drain of the first transistor, and an anode that is connected to the collector or the drain of the second transistor.

10. The power amplifier circuit according to claim 1,
    wherein a collector or a drain of the first transistor is connected to a predetermined power supply.

11. The power amplifier circuit according to claim 1,
    wherein the second transistor comprises a plurality of unit transistors that are connected in parallel.

12. The power amplifier circuit according to claim 1,
    wherein the first transistor, the second transistor, and the third transistor are bipolar transistors.

13. The power amplifier circuit according to claim 1,
    wherein at least a part of the second transistor and at least a part of the third transistor are formed on a semiconductor substrate so as to overlap a predetermined bump that connects the semiconductor substrate and a predetermined substrate in a plan view.

14. A differential power amplifier circuit, comprising:
    first and second power amplifier circuits according to claim 1,
    the first power amplifier circuit being configured to receive a first input signal having a predetermined phase, and
    the second power amplifier circuit being configured to be receive a second input signal having a reverse phase to that of the first input signal.

15. The power amplifier circuit according to claim 2, further comprising:
    a second resistive circuit element having a first end that is connected to the base or the gate of the first transistor; and a constant voltage circuit having a first end that is connected to a second end of the second resistive circuit element, and a second end that is connected to a base or a gate of the third transistor.

16. The power amplifier circuit according to claim 3, further comprising:
a second resistive circuit element having a first end that is connected to the base or the gate of the first transistor; and
a constant voltage circuit having a first end that is connected to a second end of the second resistive circuit element, and a second end that is connected to a base or a gate of the third transistor.

17. The power amplifier circuit according to claim 4, further comprising:
a second resistive circuit element having a first end that is connected to the base or the gate of the first transistor; and
a constant voltage circuit having a first end that is connected to a second end of the second resistive circuit element, and a second end that is connected to a base or a gate of the third transistor.

18. The power amplifier circuit according to claim 2, wherein a base or a gate of the third transistor is connected to the base or the gate of the second transistor.

19. The power amplifier circuit according to claim 3, wherein a base or a gate of the third transistor is connected to the base or the gate of the second transistor.

20. The power amplifier circuit according to claim 4, wherein a base or a gate of the third transistor is connected to the base or the gate of the second transistor.

* * * * *